(12) United States Patent
Hunt (10) Patent No.: US 9,800,805 B2
(45) Date of Patent: *Oct. 24, 2017

(54) FREQUENCY SELECTIVE IMAGING SYSTEM

(75) Inventor: Jeffrey H. Hunt, Thousand Oaks, CA (US)

(73) Assignee: The Boeing Company, Chicago, IL (US)

( * ) Notice: Subject to any disclaimer, the term of this patent is extended or adjusted under 35 U.S.C. 154(b) by 526 days.

This patent is subject to a terminal disclaimer.

(21) Appl. No.: 13/019,875

(22) Filed: Feb. 2, 2011

(65) Prior Publication Data

US 2012/0194713 A1    Aug. 2, 2012

(51) Int. Cl.
*H04N 5/335* (2011.01)
*B82Y 20/00* (2011.01)
*G01J 3/28* (2006.01)
*G01J 5/02* (2006.01)
*H01L 21/02* (2006.01)

(52) U.S. Cl.
CPC .............. *H04N 5/335* (2013.01); *B82Y 20/00* (2013.01); *G01J 3/2823* (2013.01); *G01J 5/023* (2013.01); *H01L 21/02603* (2013.01)

(58) Field of Classification Search
USPC ........... 250/200, 208.1, 216, 227.11, 227.23; 348/222.1, 262–283, 294–324; 977/902, 977/932, 953–954
See application file for complete search history.

(56) References Cited

U.S. PATENT DOCUMENTS

| | | | |
|---|---|---|---|
| 6,891,660 B2 | 5/2005 | Hunt et al. | |
| 6,924,925 B2 | 8/2005 | Hunt et al. | |
| 7,786,440 B2 * | 8/2010 | Peczalski et al. | 250/339.02 |
| 8,415,608 B2 * | 4/2013 | Hunt | 250/214.1 |

(Continued)

FOREIGN PATENT DOCUMENTS

| | | |
|---|---|---|
| EP | 2037243 A2 | 3/2009 |
| WO | WO2010/047844 A2 | 4/2010 |
| WO | WO2010/135439 A2 | 11/2010 |

OTHER PUBLICATIONS

C.A. Huber et al., Nanowire Array Composites, Science 263, pp. 800-802 (1994).

(Continued)

*Primary Examiner* — Michael Osinski
(74) *Attorney, Agent, or Firm* — Haynes and Boone, LLP (57) ABSTRACT

An apparatus, system, and method are disclosed for a frequency selective imager. In particular, the frequency selective imager includes an array of pixels arranged in a focal plane array. Each pixel includes at least one nanoparticle-sized diameter thermoelectric junction that is formed between nanowires of different compositions. When a nanoparticle-sized diameter thermoelectric junction senses a photon, the nanoparticle-sized diameter thermoelectric junction emits an electrical pulse voltage that is proportional to an energy level of the sensed photon. In one or more embodiments, the frequency selective imager is a frequency selective optical imager that is used to sense photons having optical frequencies. In at least one embodiment, at least one of the nanowires in the frequency selective imager is manufactured from a compound material including Bismuth (Bi) and Tellurium (Te).

5 Claims, 5 Drawing Sheets

(56) References Cited

U.S. PATENT DOCUMENTS

| | | | |
|---|---|---|---|
| 8,686,346 B2* | 4/2014 | Hunt | 250/227.23 |
| 8,729,456 B2* | 5/2014 | Hunt | 250/227.23 |
| 2009/0020787 A1* | 1/2009 | Shioya et al. | 257/213 |
| 2009/0072145 A1* | 3/2009 | Peczalski et al. | 250/339.04 |
| 2010/0308214 A1* | 12/2010 | Wober | 250/227.11 |
| 2011/0133061 A1* | 6/2011 | Yu et al. | 250/214.1 |
| 2011/0136288 A1* | 6/2011 | Duane et al. | 438/59 |
| 2012/0062317 A1* | 3/2012 | Huber | 330/69 |
| 2012/0145880 A1* | 6/2012 | Wober | 250/208.1 |
| 2012/0193521 A1* | 8/2012 | Hunt | 250/227.23 |
| 2012/0207484 A1* | 8/2012 | Hunt | 398/202 |
| 2013/0001407 A1* | 1/2013 | Hunt et al. | 250/225 |
| 2013/0155299 A1* | 6/2013 | Hunt | 348/294 |
| 2016/0169736 A1* | 6/2016 | Belk | G01J 1/42 |
| | | | 250/208.1 |

OTHER PUBLICATIONS

T.E. Huber et al. Confinement Effects and Surface Charge in Bi Nanowires, Appl. Phys. Lett. 84, pp. 1326-1328 (2004).

P. Jones et al., Electrical contact resistance of individual bismuth telluride nanowires, Proc. 25th Int. Conf. Thermoelectrics held 2006 (IEEE, Piscattaway, 2007). pp. 693-696.

Great Britain Search Report, Patent Application Ser. No. GB1201878.4, dated Apr. 25, 2012.

Optoelectronics and Nanophotonics NASA article [SEE http://www.nasa.gov/centers/ames/research/technology-onepagers/opto-electronics.html], webpage last updated on Mar. 29, 2008.

* cited by examiner

FREQUENCY SELECTIVE IMAGING SYSTEM

BACKGROUND

The present disclosure relates to imaging systems. In particular, it relates to frequency selective imaging systems.

SUMMARY

The present disclosure relates to a system, method, and apparatus for a frequency selective imager. In one or more embodiments, the disclosed frequency selective imager includes an array of pixels arranged in a focal plane array. A pixel includes at least one nanoparticle-sized diameter thermoelectric junction that is formed between nanowires of different compositions. A nanowire has a diameter in a size range associated with nanoparticles, which are 1-100 nanometers (nm) in size. The length of a nanowire is longer than the diameter of the nanowire, and the length of a nanowire can be in a size range from millimeters (mm) to centimeters (cm). When at least one nanoparticle-sized diameter thermoelectric junction senses at least one photon, the nanoparticle-sized diameter thermoelectric junction(s) emits at least one electrical pulse having a voltage that is proportional to an energy level of the photon(s).

In one or more embodiments, at least one of the nanowires is manufactured from a compound material including Bismuth (Bi) and Tellurium (Te). In at least one embodiment, the frequency selective imager is a frequency selective optical imager that is used to sense photons having optical frequencies. In some embodiments, the material of at least one of the nanowires is selected according to the frequency of the photons that are desired to be sensed. In one or more embodiments, the diameter of at least one nanoparticle-sized diameter thermoelectric junctions is selected according to the frequency of the photons that are desired to be sensed.

In at least one embodiment, a frequency selective imaging system includes at least one intensity control device that selects a range of the rate of arrival of the photons that are desired to be sensed. The system further includes at least one polarization control device for selecting the polarization of the photons that are desired to be sensed. Also, the system includes at least one focusing element for focusing the photons that are being sensed.

In addition, the frequency selective imaging system includes at least one frequency selective imager. The frequency selective imager(s) detects the photons that are focused from the focusing element(s). When at least one frequency selective imager senses at least one photon, the frequency selective imager(s) emits at least one electrical pulse having a voltage that is proportional to an energy level of the sensed photon(s). Also, the system includes at least one processor for processing at least one emitted electrical pulse and for generating a multi-spectral image from information from the emitted electrical pulse(s).

In at least one embodiment, at least one intensity control device is an electromagnetic energy-filtering device. In one or more embodiments, at least one polarization control device is a polarizer. In at least one embodiment, the polarizer selects horizontal polarization, vertical polarization, left-hand circular polarization, and/or right-hand circular polarization. In one or more embodiments, at least one focusing element is a signal collection lens. In at least one embodiment, at least one frequency selective imager includes an array of pixels arranged in a focal plane array, where a pixel includes at least one nanoparticle-sized diameter thermoelectric junction that is formed between nanowires of different compositions. In addition, at least one of the nanowires is manufactured from a compound material including Bismuth (Bi) and Tellurium (Te).

In one or more embodiments, a method consisting of a frequency selective imaging system involves propagating at least one photon into the input of at least one intensity control device. The method further involves selecting, with at least one intensity control device, a range of the rate of arrival of the photons that are desired to be sensed. Also, the method involves propagating at least one photon from the output of at least one intensity control device into the input of at least one polarization control device. In addition, the method involves selecting, with at least one polarization control device, the polarization of the photons that are desired to be sensed. The method additionally involves propagating at least one photon from the output of at least one polarization control device onto the collection surface of at least one focusing element. In addition, the method involves focusing, with at least one focusing element, at least one photon that is being collected onto at least one frequency selective imager.

Further, the method involves detecting, with at least one frequency selective imager, at least one photon that was focused by at least one focusing element. Additionally, the method involves emitting, from the output of at least one frequency selective imager, at least one electrical pulse having a voltage that is proportional to the energy level of the detected photon(s). In addition, the method involves processing, with at least one processor, at least one emitted electrical pulse. Also, the method involves generating, with at least one processor, a multi-spectral image from information from the emitted electrical pulse(s).

DRAWINGS

These and other features, aspects, and advantages of the present disclosure will become better understood with regard to the following description, appended claims, and accompanying drawings where:

DESCRIPTION

The methods and apparatus disclosed herein provide an operative system for a frequency selective imager. In particular, the present disclosure uses nanowires to build a frequency selective imager to be employed by the disclosed frequency selective imaging system. For the frequency selective imager, an array of pixels is arranged in a focal plane array. Each pixel in the array includes at least one nanoparticle-sized diameter thermoelectric junction that is formed between nanowires of different compositions. The nanoparticle-sized diameter thermoelectric junctions allow the frequency selective imager to be able to convert the detected electromagnetic signals into electrical signals, while maintaining the wavelength (i.e. frequency) information associated with the detected electromagnetic signals.

The disclosed frequency selective imager is preferably a frequency selective optical imager for sensing photons having optical frequencies. However, in alternative embodiments, the disclosed frequency selective imager may be manufactured to detect frequencies of electromagnetic radiation other than optical frequencies. In addition, the nanowires are preferably manufactured from a compound material containing Bismuth (Bi) and Tellurium (Te) (e.g., Bismuth Telluride ($Bi_2Te_3$)). However, in other embodiments of the present disclosure, the nanowires may be manufactured from other materials that exhibit thermoelectric properties that are similar to the thermoelectric properties of Bismuth Telluride.

To understand the features of the disclosed frequency selective imager, a brief discussion regarding conventional optical imaging sensors is presented. Conventional optical imaging sensors typically operate as bulk frequency absorption devices. In fact, most conventional optical imaging sensors employ bulk semiconductors, which absorb electromagnetic radiation across large frequency ranges and have no means to discriminate against electromagnetic radiation in specific frequency ranges. Conventional optical imaging sensors typically include a focal plane array of detectors. Each detector is a semiconductor pixel. These pixels absorb images at all frequencies, and convert them into electrical signal equivalents. However, these pixels have no means to maintain the wavelength selectivity in the image and, thus, that information is lost.

In order for these optical imaging sensors to be able to determine the colors they are sensing (i.e. achieve color discrimination), their pixels are typically grouped into square groupings of four, and a Bayer mask is placed in front of each square grouping of four pixels. A Bayer mask includes four color filters that are arranged in the form of a square. A Bayer mask has one red filter, one blue filter, and two green filters. Bayer masks include two green filters because the human eye is more sensitive to green than to red or blue. Each grouping of four pixels sends its sensed information to a processor for determining the specific color that they detect. As such, in order for these conventional optical imaging systems to be able to achieve color discrimination, a substantial amount of computation is required. In addition, it should be noted that the use of the four color filters results in reduced sensitivity of the sensor, lower image resolution, and increased noise. Additionally, it should be noted that the term "color" refers to the portion of the electromagnetic spectrum that is visible to the human eye. A typical human eye will respond to wavelengths that are approximately 330-770 nanometers (nm) in length. As such, the use of the term "color" here applies to the visible range of wavelengths, but it is directly analogous to any spectral regime that requires frequency discriminating optical elements.

As can be observed from the discussion above, optical imaging that can detect single-photons while maintaining wavelength sensitivity is very challenging to achieve. However, a pixel employing a nanoparticle-sized diameter thermoelectric junction can achieve this type of optical imaging.

When a thermoelectric element is exposed to light, the electromagnetic field is dissipated in the element, and the energy that is deposited generates electrical power that can be used for sensing the light. This type of thermoelectric element is generally referred to as a bolometer. Generally, a bolometer is a device for measuring the energy of incident electromagnetic radiation.

It is possible to fabricate nanoparticle-sized bolometers from nanoparticle-sized diameter junctions between nanowires of different compositions. These nanoparticle-sized diameter junctions respond to individual photons by emitting an individual electrical pulse having a voltage that is proportional to the temperature change caused by the absorption of the photon. The temperature change is proportional to the energy of the photon. Thus, these nanoparticle-sized diameter junctions are sensitive to wavelength. Recently, it has been demonstrated that as the wire diameter of a nanoware is reduced, thermal transport in the nanowire is drastically decreased because of less phonon scattering within the nanowire walls.

Currently, the imagers that operate in the single photon regime are limited to image-intensifier tubes. These devices do not have wavelength selectivity. Image-intensifier tubes are constructed from tubes that are very delicate and, thus, they can easily be damaged. In addition, image-intensifier tubes require separate power supply devices. The frequency selective imager of the present disclosure will not only solve the problems associated with these devices, but will also allow for wavelength selectivity.

In the following description, numerous details are set forth in order to provide a more thorough description of the system. It will be apparent, however, to one skilled in the art, that the disclosed system may be practiced without these specific details. In the other instances, well known features have not been described in detail so as not to unnecessarily obscure the system.

Figure 1:
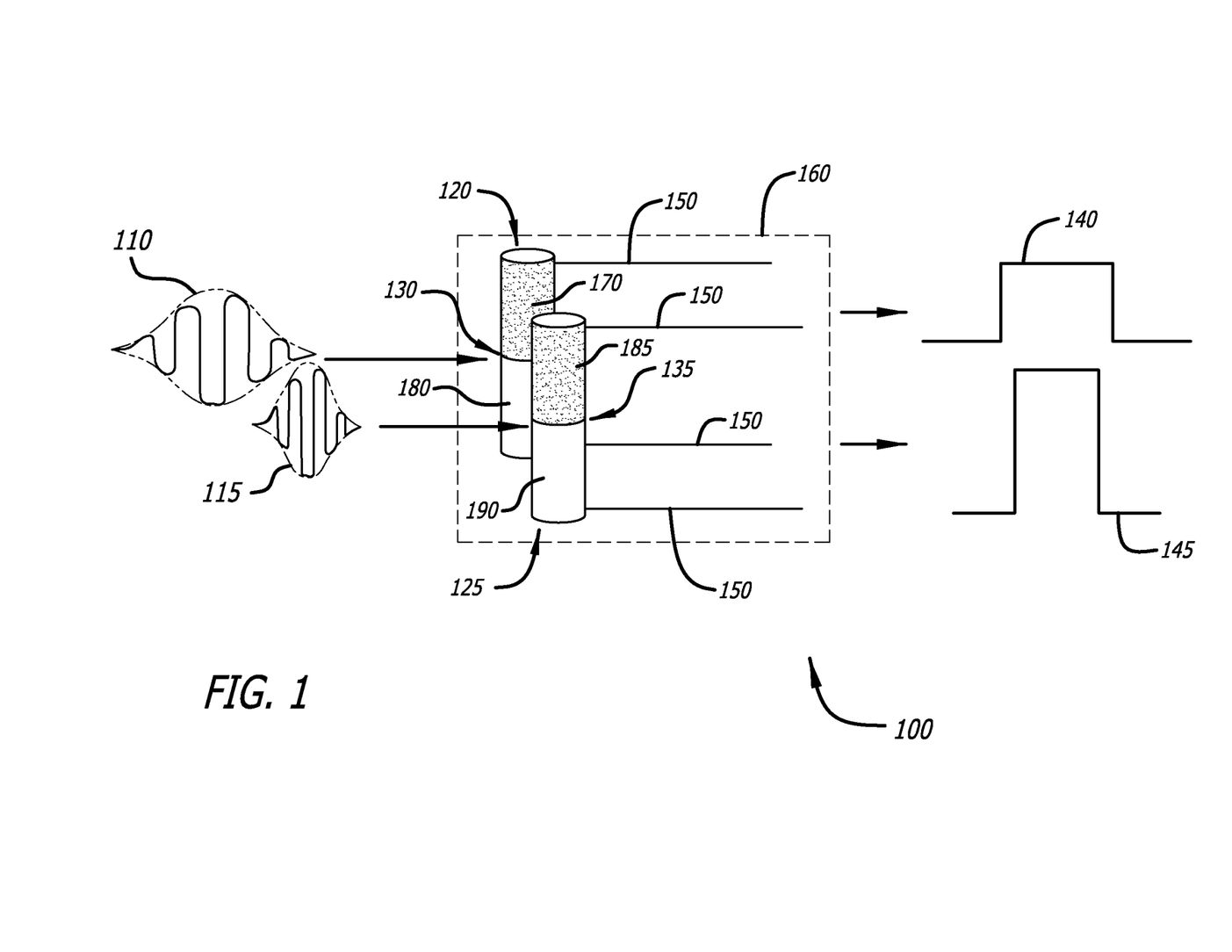
FIG. 1 illustrates a simplified block diagram of the disclosed frequency selective imager during operation, in accordance with at least one embodiment of the present disclosure.

FIG. 1 shows a simplified block diagram of the disclosed frequency selective imager during operation 100, in accordance with at least one embodiment of the present disclosure. In this figure, two photons 110, 115 are shown to be propagated towards a frequency selective imager 160. Each photon has a frequency (e.g., photon 110 has frequency v1 and photon 115 has frequency v2), which is proportional to its respective level of energy (e.g, photon 110 has energy level E1 and photon 115 has energy level E2). Energy (E) is equal to hv, where h is equal to the Planck constant and v is equal to frequency. It should be noted that for a given frequency (v), its corresponding wavelength (λ) is equal to c/v, where c is equal to the speed of light.

Also in this figure, the frequency selective imager 160 includes a pixel array comprising two pixels. Each of the two pixels includes one composite nanowire 120, 125. The two composite nanowires 120, 125 are shown to each fabricated from two different materials 170, 180 and 185, 190. Two electrical terminals 150 are shown to be connected to each end of each nanowire 120, 125. Each nanowire 120, 125 has a nanoparticle-sized diameter thermoelectric junction 130, 135 that is formed between the two different materials 170, 180 and 185, 190. During operation of the disclosed frequency selective imager 160, when the nanoparticle-sized diameter thermoelectric junctions 130, 135 each sense a photon 110, 115, each nanoparticle-sized diameter thermoelectric junction 130, 135 emits an electrical pulse 140, 145 via its respective electrical terminals 150. The voltage of each of the emitted electrical pulses 140, 145 is proportional to the sensed photon's 110, 115 level of energy and, thus, the magnitude of each of the emitted electrical pulses 140, 145 can be used to determine the photon's 110, 115 associated frequency.

With regard to the nanoparticle-sized diameter thermoelectric junctions 130, 135, the thermoelectric effect is the effect in the nanoparticle-sized diameter thermoelectric junctions 130, 135 where a temperature difference causes a voltage to be generated. Typically, values are measured in microvolts (μV) per Kelvin (K). When a temperature difference is applied to the nanoparticle-sized diameter thermoelectric junctions 130, 135, the charged carriers in the nanowire 120, 125, whether they are electrons or holes, diffuse from the nanoparticle-sized diameter thermoelectric junctions 130, 135 to their respective connecting electrical terminals 150. In this way, the behavior is similar to the way that a classical gas expands when heated. As a result, the mobile charged carriers migrating to the electrical terminals 150 leave behind their oppositely charged and immobile nuclei at the nanoparticle-sized diameter thermoelectric junctions 130, 135, thus giving rise to a thermoelectric voltage. As such, the nanoparticle-sized diameter thermoelectric junctions 130, 135 are each in essence operating as a thermoelectric semiconductor.

As previously mentioned, the frequency selective imager 160 is preferably manufactured from a compound material containing Bismuth (Bi) and Tellurium (Te), such as Bismuth Telluride ($Bi_2Te_3$). However, the frequency selective imager 160 may be manufactured from other materials that exhibit thermoelectric properties that are similar to the thermoelectric properties of Bismuth Telluride. In general, the materials to be used are selected according to the desired operational frequency range of the frequency selective imager 160. In addition, it should be noted that the diameter of the nanoparticle-sized diameter thermoelectric junctions 130, 135 will also generally be selected according to the desired operational frequency range.

It should be noted that the operational frequency detection regime of any material operating as a conventional semiconductor is limited to shorter wavelengths because photons having longer wavelengths do not have enough energy to excite the electrons across the material band gap. When wavelengths have photon energy that is below that of the material band gap, the semiconductor material will not respond. Operating as a thermoelectric semiconductor, Bismuth Telluride (BiTe) has a very small band gap. Depending upon the exact composition of the BiTe material, the band gap will be approximately 30-50 milli electron volts (meV). Thus, the implication is that the disclosed frequency selective imager 160, when manufactured from BiTe, will operate as a frequency selective optical imager from the soft ultraviolet (UV) spectrum (~300 nanometers (nm)) throughout the visible light spectrum (~400 to 770 nm) well into the infrared spectrum (~770 nm to 20 microns).

Figure 2:
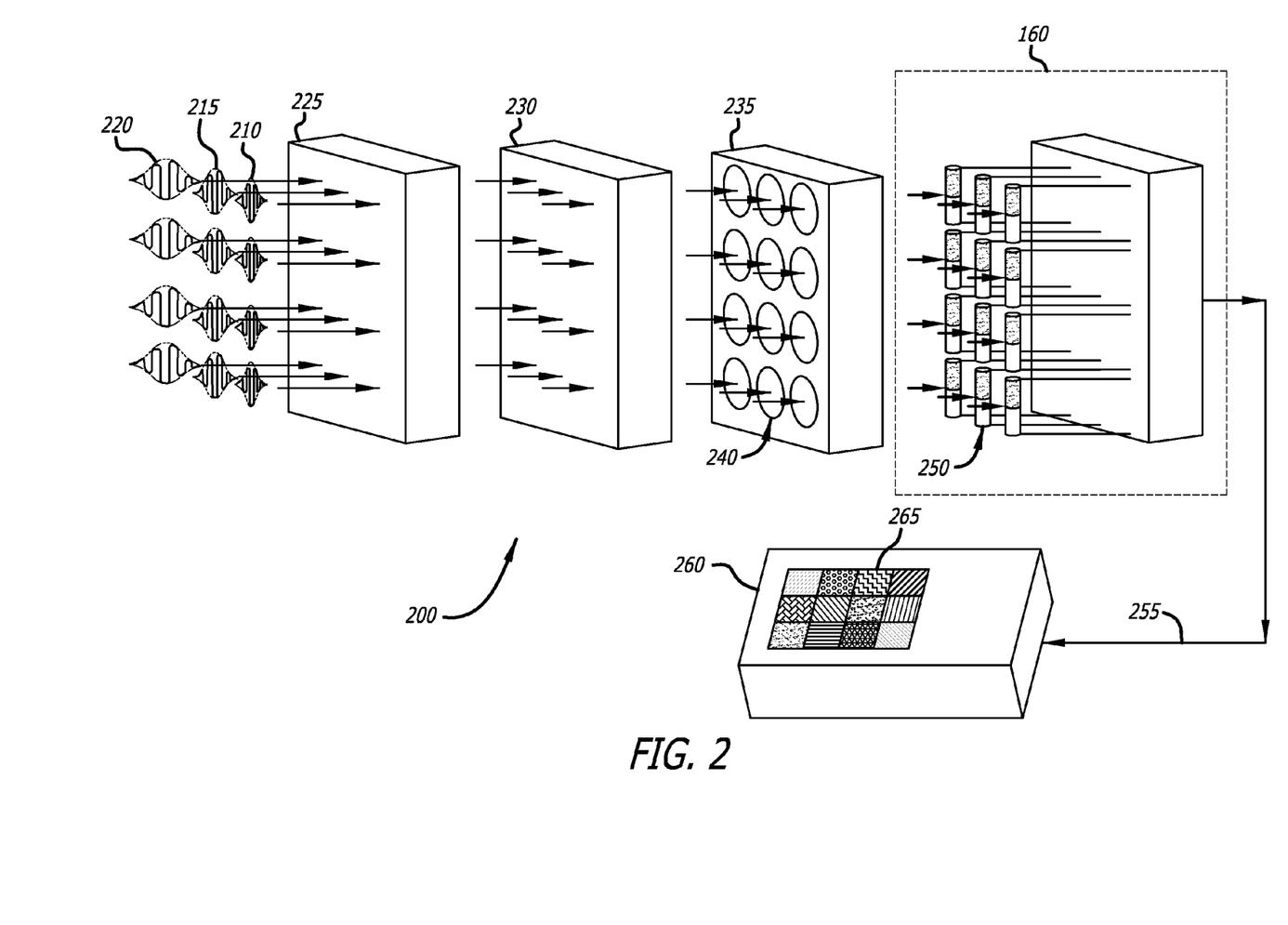
FIG. 2 shows a simplified block diagram of the disclosed frequency selective imaging system, in accordance with at least one embodiment of the present disclosure.

FIG. 2 shows a simplified block diagram of the disclosed frequency selective imaging system 200, in accordance with at least one embodiment of the present disclosure. In order to understand the operation of the disclosed system 200, the path of a few photons 210, 215, 220 travelling through the system 200 is described. It should be noted that each of the photons 210, 215, 220 has a different wavelength (i.e. the photons are multi-spectral).

In this figure, the photons 210, 215, 220 are shown to be propagated into an intensity control device 225. The intensity control device 225 is used to set a range of operation for the disclosed system 200 (i.e. to select a range of the rate of arrival of the photons that are desired to be sensed) and, thus, it operates as an electromagnetic energy filtering device. In one or more embodiments, types of devices that may be employed for the disclosed intensity control device 225 include, but are not limited to, a neutral-density filter and a dark color filter.

The photons 210, 215, 220 are outputted from the intensity control device 225 and are propagated into a polarization control device 230. The polarization control device 230 is utilized for selecting a polarization of the photons that are desired to be sensed and, as such, it operates as a polarizer. In one or more embodiments, the polarization control device 230 may select various different polarizations including, but not limited to, horizontal polarization, vertical polarization, left-hand circular polarization, and right-hand circular polarization. Types of devices that may be used for the disclosed polarization control device 230 include, but are not limited to, a polarization plate, a Brewster's angle polarizer, and a thin film polarizer. The precise type of polarizer device to be selected for the system 200 depends upon the particular engineering requirements, such as the polarization rejection ratio, the size and weight limitations of the polarizer, and the wavelength range of operation.

From the output of the polarization control device 230, the photons 210, 215, 220 are propagated onto a collection surface of a focusing element 235. The focusing element 235 is shown to include an array of lenses 240. In one or more embodiments, types of devices to be employed for the focusing element 235 include, but are not limited to, a single lens, a double lens, an array of lenses, a Fresnel lens, refractive elements, reflective elements (e.g., concave mirrors), and other related lens systems up to the complexity of a fully engineered telescope. The focusing element 235 is used to focus the photons 210, 215, 220 onto a frequency selective imager 160. The frequency selective imager 160 includes an array of pixels arranged in a focal plane array. Each of the pixels includes one nanowire 250, and each nanowire 250 is shown to be fabricated from two different materials.

Once the frequency selective imager 160 senses the photons 210, 215, 220, the frequency selective imager 160 emits electrical pulses that each have a voltage that is proportional to the respective sensed photon's 210, 215, 220 energy level. The electrical pulses are sent via a composite array output 255 to the input of a processor 260 for processing. The processor 260 then uses the emitted electrical pulse information to determine each of the photon's 110, 115, 120 associated frequency and/or wavelength. The processor 260 uses this information from the photons 110, 115, 120 to generate a multi-spectral image 265.

It should be noted that in alternative embodiments, the array of pixels in the frequency selective imager 160 may be arranged in a scanning linear array rather than in a focal plane array. In addition, in some embodiments, each pixel may include more than one nanowire 250 (i.e. each pixel may include more than one nanoparticle-sized diameter thermoelectric junction). Additionally, in at least one embodiment, a pixel may include other additional devices (e.g., a charge-coupled device (CCD)) than just a nanowire(s).

For the disclosed system 200, a procedure is necessary to provide for frequency calibration. Typically, this involves using emission spectra from samples (e.g., neon and mercury) that have frequency outputs that are well characterized and traceable to a standard calibration, such as the National Institute of Standards and Technology (NIST) standards. With these outputs propagated through the frequency selective imager 160 and operationally correlated to the known standards, the overall system 200 will be frequency calibrated.

In addition, a procedure is necessary to provide for temporal calibration for the system 200. Generally, this involves using timing pulses at one or more frequencies that have pulse spacing that is well defined. Usually, high precision devices will be tied to absolute standards generated by NIST or some other carefully calibrated sources. With these outputs propagated though the frequency selective imager 160 and operationally correlated to the known standards, the overall system 200 will be temporally calibrated.

Figure 3:
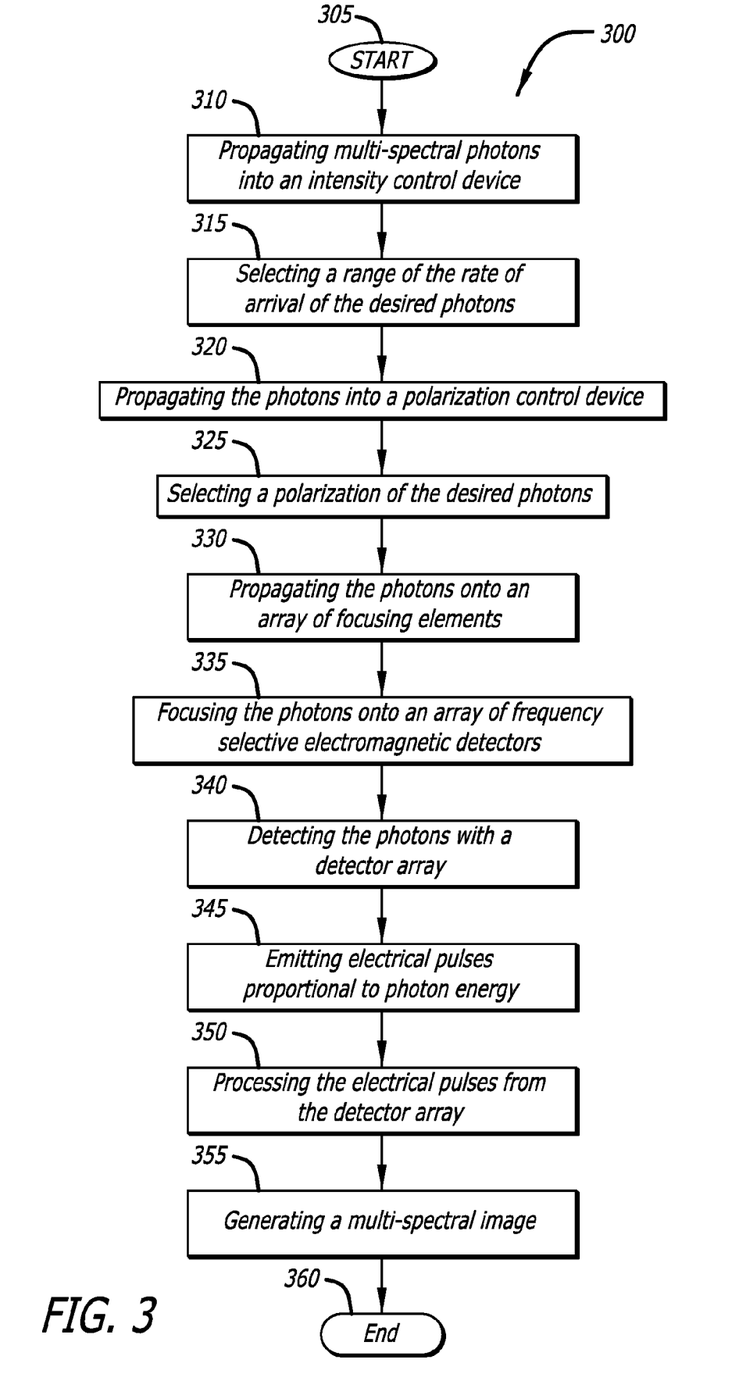
FIG. 3 displays a flow chart of the disclosed method for using the disclosed frequency selective imaging system, in accordance with at least one embodiment of the present disclosure.

FIG. 3 shows a flow chart 300 of the disclosed method for using the disclosed frequency selective imaging system, in accordance with at least one embodiment of the present disclosure. It should be noted that, in one or more embodiments of the present disclosure, the steps as shown in the flow chart 300 may be performed in a variety of different orders than as depicted in the figure. In addition, it should be noted that in some embodiments, at least one of the steps as shown in the flow chart 300 may be omitted from the method.

At the start 305 of the disclosed method, multi-spectral photons are propagated into an intensity control device 310. Then, a range of the rate of arrival of the desired photons is selected 315. The photons are then propagated into a polarization control device 320. A selection of the polarization of the desired photons 325 is performed. Then, the photons are propagated onto an array of focusing elements 330. The photons are then focused onto an array of frequency selective electromagnetic detectors 335. After the photons are focused onto the detectors, the photons are detected with the detector array 340. Once the photons are detected, electrical pulses, which have voltages that are proportional to each of the individual photon's energy level, are emitted 345. Then, the emitted electrical pulses from the detector array are processed 350 in order to determine each of the photon's associated frequency and/or wavelength. Once the electrical pulses are processed, a multi-spectral image is generated 355 using the information from the photons. After a multi-spectral image is generated, the method ends 360.

Figure 4:
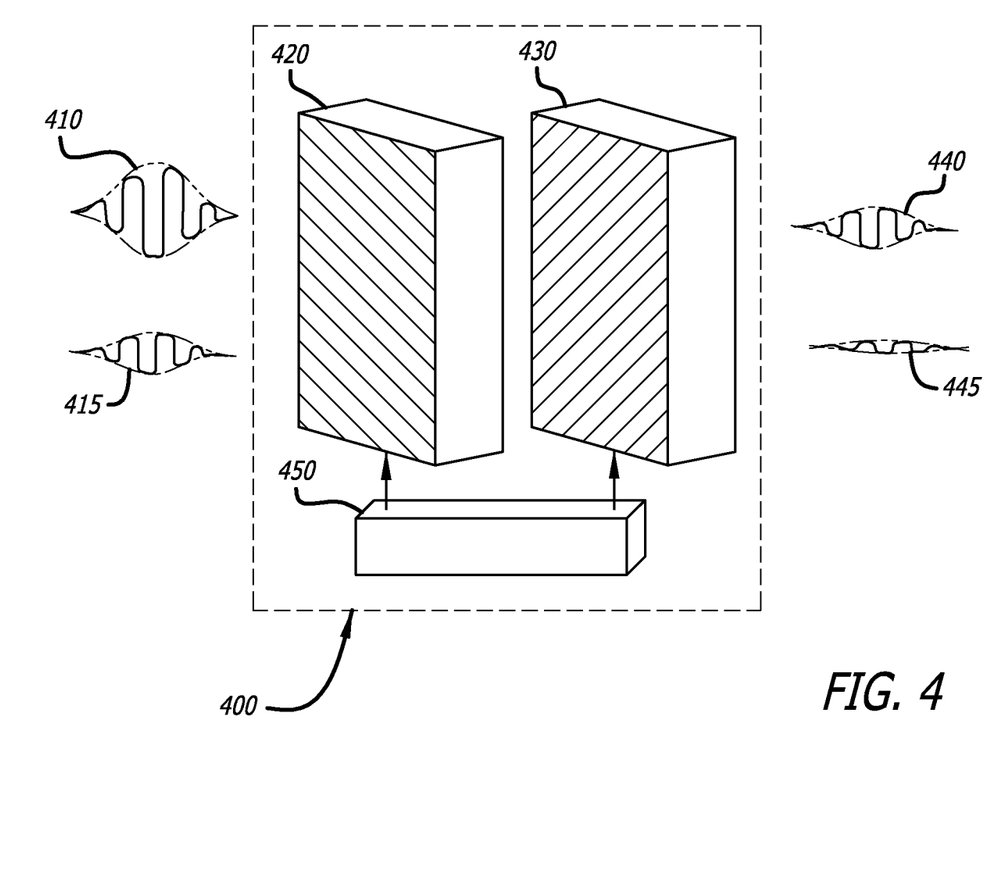
FIG. 4 shows a simplified block diagram of a cross-polarization filter device to optionally be employed by the frequency selective imaging system of FIG. 2, in accordance with at least one embodiment of the present disclosure.

FIG. 4 illustrates a simplified block diagram of a cross-polarization filter device 400 to optionally be employed by the disclosed frequency selective imaging system 200 of FIG. 2, in accordance with at least one embodiment of the present disclosure. In one or more embodiments of the present disclosure, the disclosed frequency selective imaging system 200 uses the cross-polarization filter device 400 instead of both the intensity control device 225 and the polarization control device 230.

In FIG. 4, the cross-polarization filter device 400 includes two cross-polarization filters 420, 430 and a controller 450. The controller 450 sets the time-varying polarizations of the two cross-polarization filters 420, 430. When the polarization orientation of the second filter 430 is time-varied relative to the first filter 420, the intensity of the photons can be obtained by the device 400. In addition, by varying the polarization of the first filter 420, the device can obtain the polarization of the photons.

Also in this figure, photon packets 410, 415 are shown to be propagated into the cross-polarization filter device 400. The photon packets 410, 415 have different intensities (i.e. photon packet 410 contains a different number of photons than photon packet 415). The intensities of the photon packets 410, 415 will decrease as the polarizations of the two cross-polarization filters 420, 430 approach right angles (i.e. the polarizations become perpendicular to one another). The photon packets 440, 445 outputted by the cross-polarization filter device 400 are shown to be attenuated. It should be noted that photon packets that are attenuated below the detection threshold of the frequency selective imager 160 (e.g., photon packet 445) will not be detected by the imager 160.

Figure 5:
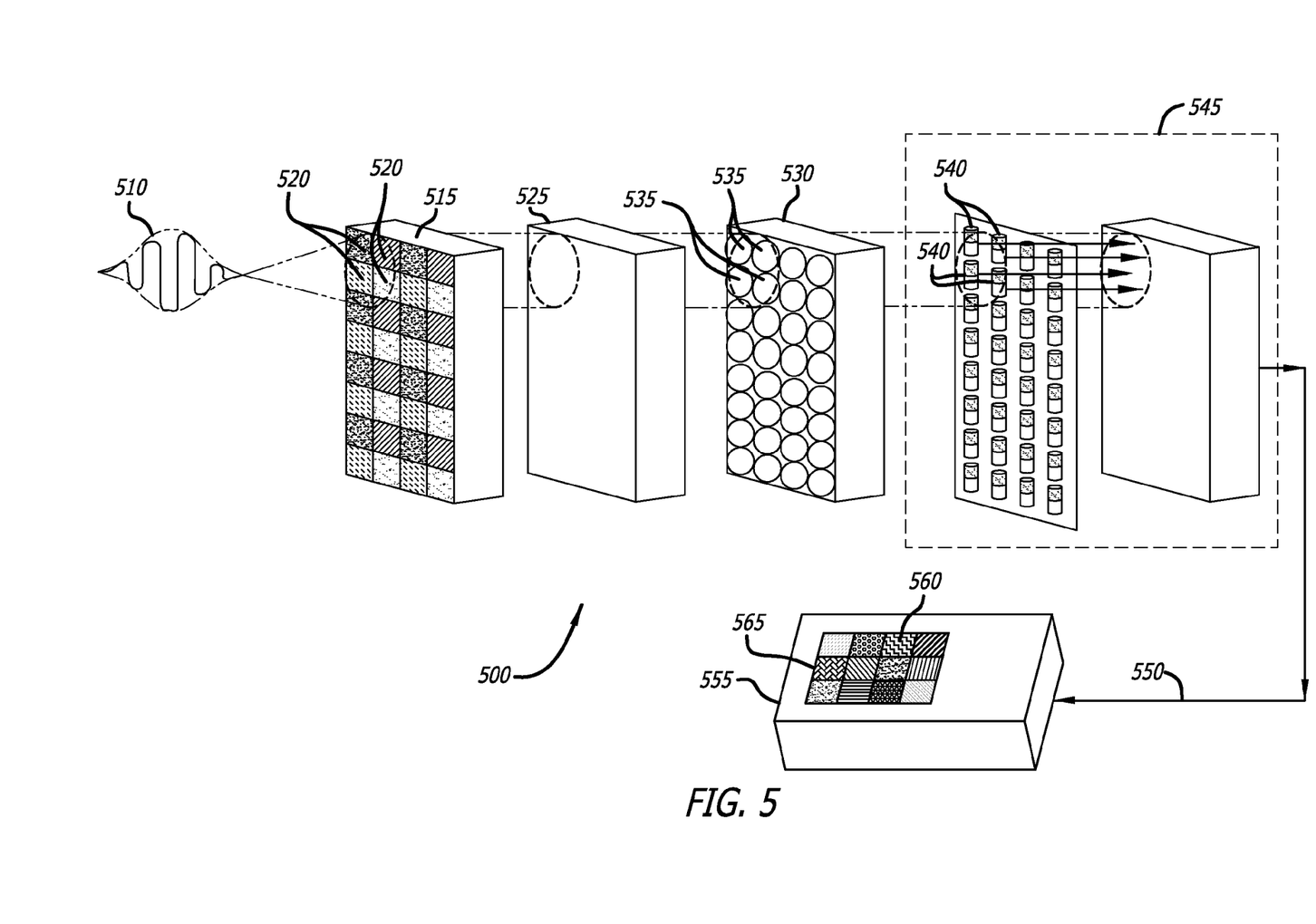
FIG. 5 illustrates a simplified block diagram of a frequency selective imaging system that employs neutral density (ND) filters for intensity discrimination, in accordance with at least one embodiment of the present disclosure.

FIG. 5 depicts a simplified block diagram of a frequency selective imaging system 500 that employs neutral density (ND) filters 520 for intensity discrimination, in accordance with at least one embodiment of the present disclosure. In particular, this system 500 achieves intensity discrimination by illuminating multiple detectors 540 that have different ND filters 520, and combining the detector outputs to form the pixel image 565. In order to understand the operation of system 500, the path of a single photon packet 510 (i.e. a packet containing a number of photons) travelling through the system 500 is described.

In this figure, a photon packet 510 is shown to be propagated into an intensity control device 515. The intensity control device 515 comprises a plurality of ND filters 520. The ND filters 520 are grouped into square groupings of four ND filters 520 per group. Each of the four ND filters 520 in a single square group has a different level of neutral-density filtering.

The photon packet 510 is outputted from the intensity control device 515 and is propagated into a polarization control device 525. The polarization control device 525 is used for selecting the polarization of the photons that are desired to be sensed and, thus, it operates as a polarizer.

From the output of the polarization control device 525, the photon packet 510 is propagated onto a collection surface of multiple lenses 535 of a focusing element 530. The focusing element 530 is shown in this figure to include an array of lenses 535. The focusing element 530 is used to focus the photons of the photon packet 510 onto a frequency selective imager 545. The frequency selective imager 545 is shown to include an array of nanowires 540, which are each fabricated from two different materials.

Once the frequency selective imager 545 senses the photons of the photon packet 510, the frequency selective imager 545 emits electrical pulses that each have a voltage that is proportional to the respective sensed photon's energy level. The electrical pulses are sent via a composite array output 550 to the input of a processor 555 for processing. The processor 555 then uses the emitted electrical pulse information to determine each of the photon's associated frequency and/or wavelength. The processor 555 combines this information from the photons to generate an image pixel 560.

Although certain illustrative embodiments and methods have been disclosed herein, it can be apparent from the foregoing disclosure to those skilled in the art that variations and modifications of such embodiments and methods can be made without departing from the true spirit and scope of the art disclosed. Many other examples of the art disclosed exist, each differing from others in matters of detail only. Accordingly, it is intended that the art disclosed shall be limited only to the extent required by the appended claims and the rules and principles of applicable law.

I claim:

1. A frequency selective imager, the imager comprising:
   an array of pixels arranged in a focal plane array,
   wherein each of the pixels includes at least one nanoparticle-sized diameter thermoelectric junction comprising an interface between two nanowires of different materials, wherein the two different materials both comprise a single element material or the two different materials both comprise a compound material, and
   wherein when the at least one nanoparticle-sized diameter thermoelectric junction senses at least one photon, each of the at least one nanoparticle-sized diameter thermoelectric junction emits at least one electrical pulse having a voltage that is proportional to an energy level related to a wavelength of the at least one photon, thereby discriminating the wavelength of the at least one photon.

2. The frequency selective imager of claim 1, wherein at least one of the nanowires is manufactured from a compound material including Bismuth (Bi) and Tellurium (Te).

3. The frequency selective imager of claim 1, wherein the imager is a frequency selective optical imager that is used to sense photons having optical frequencies.

4. The frequency selective imager of claim 1, wherein a material of at least one of the nanowires is selected according to a frequency of the at least one photon that is to be sensed.

5. The frequency selective imager of claim 1, wherein a diameter of the at least one nanoparticle-sized diameter thermoelectric junction is selected according to a frequency of the at least one photon that is to be sensed.

* * * * *